(12) United States Patent
Hong et al.

(10) Patent No.: US 11,856,691 B2
(45) Date of Patent: Dec. 26, 2023

(54) STRETCHABLE SENSOR AND METHOD OF MANUFACTURING THE SAME AND WEARABLE DEVICE

(71) Applicants: Samsung Electronics Co., Ltd., Suwon-si (KR); Seoul National University R&DB Foundation, Seoul (KR)

(72) Inventors: Yongtaek Hong, Seoul (KR); Hyeon Cho, Seoul (KR); Byeongmoon Lee, Seoul (KR)

(73) Assignees: Samsung Electronics Co., Ltd., Gyeonggi-do (KR); Seoul National University R&DB Foundation, Seoul (KR)

( * ) Notice: Subject to any disclaimer, the term of this patent is extended or adjusted under 35 U.S.C. 154(b) by 180 days.

(21) Appl. No.: 17/496,309

(22) Filed: Oct. 7, 2021

(65) Prior Publication Data
US 2022/0279646 A1    Sep. 1, 2022

(30) Foreign Application Priority Data
Feb. 26, 2021    (KR) ........................ 10-2021-0026817

(51) Int. Cl.
| | |
|---|---|
| G01L 9/00 | (2006.01) |
| H05K 1/02 | (2006.01) |
| H05K 1/09 | (2006.01) |
| H05K 1/03 | (2006.01) |
| H01F 1/147 | (2006.01) |
| G01L 1/22 | (2006.01) |
| G01L 9/04 | (2006.01) |

(52) U.S. Cl.
CPC .......... *H05K 1/0283* (2013.01); *G01L 1/2287* (2013.01); *G01L 9/04* (2013.01); *H01F 1/147* (2013.01); *H05K 1/032* (2013.01); *H05K 1/0393* (2013.01); *H05K 1/092* (2013.01); *H05K 2201/10151* (2013.01)

(58) Field of Classification Search
CPC .... H05K 1/0283; H05K 1/032; H05K 1/0393; H05K 1/092; H05K 2201/10151; G01L 1/2287; G01L 9/04; H01F 1/147
See application file for complete search history.

(56) References Cited

U.S. PATENT DOCUMENTS

| | | | |
|---|---|---|---|
| 7,557,367 B2 * | 7/2009 | Rogers ................... | B82Y 10/00 257/40 |
| 9,872,624 B2 * | 1/2018 | Fuji ..................... | A61B 5/02141 |
| 9,945,739 B2 | 4/2018 | Jeon et al. | |

(Continued)

FOREIGN PATENT DOCUMENTS

| | | |
|---|---|---|
| JP | 6469484 B2 | 2/2019 |
| KR | 10-2141995 B1 | 8/2020 |

(Continued)

*Primary Examiner* — Max H Noori
*Assistant Examiner* — Masoud H Noori
(74) *Attorney, Agent, or Firm* — Harness, Dickey & Pierce, P.L.C.

(57) ABSTRACT

A stretchable sensor includes a stretchable layer including an elastomer, and a conductive layer at least partially buried in the stretchable layer and including a conductive nanostructure. The stretchable layer includes a plurality of first regions including a ferromagnetic material buried in the elastomer, and a second region excluding the plurality of first regions.

20 Claims, 14 Drawing Sheets

(56) References Cited

U.S. PATENT DOCUMENTS

| | | | |
|---|---|---|---|
| 2008/0157235 A1* | 7/2008 | Rogers | H01L 29/0657 257/415 |
| 2012/0021954 A1* | 1/2012 | Gazit | B01J 19/0046 977/789 |
| 2012/0132930 A1* | 5/2012 | Young | H05K 1/0313 257/E31.127 |
| 2017/0224257 A1 | 8/2017 | Rogers | |
| 2019/0237269 A1 | 8/2019 | Fan et al. | |

FOREIGN PATENT DOCUMENTS

| | | |
|---|---|---|
| KR | 10-2147274 B1 | 8/2020 |
| KR | 10-2149829 B1 | 9/2020 |

* cited by examiner

STRETCHABLE SENSOR AND METHOD OF MANUFACTURING THE SAME AND WEARABLE DEVICE

CROSS-REFERENCE TO RELATED APPLICATION

This application claims priority to and the benefit of, under 35 U.S.C. § 119, Korean Patent Application No. 10-2021-0026817 filed in the Korean Intellectual Property Office on Feb. 26, 2021, the entire contents of which are incorporated herein by reference.

BACKGROUND

1. Field

A stretchable sensor, a method of manufacturing the same, and a wearable device are disclosed.

2. Description of the Related Art

A sensor such as a strain sensor and a pressure sensor is a sensor configured to detect a degree of physical deformation caused by an external force, and may be applied to a wearable device attached to a living body or an object.

SUMMARY

Some example embodiments provide a stretchable sensor that is applied to a living body or an object and may effectively detect the degree of physical deformation.

Some example embodiments provide a method of manufacturing the stretchable sensor.

Some example embodiments provide a wearable device including the stretchable sensor.

According to some example embodiments, a stretchable sensor may include a stretchable layer including an elastomer, and a conductive layer at least partially buried in the stretchable layer and including a conductive nanostructure. The stretchable layer may include a plurality of first regions including a ferromagnetic material buried in the elastomer, and a second region excluding the plurality of first regions.

The plurality of first regions and the second region of the stretchable layer may have an elastic modulus different from each other.

The plurality of first regions may be separately distributed along an in-plane direction of the stretchable layer, and the second region may be a single piece of material comprising portions that are continuously connected in the stretchable layer.

The plurality of first regions and separate portions of the second region may be alternately arranged along the length direction of the stretchable layer.

Each first region of the plurality of first regions may extend in the thickness direction of the stretchable layer.

An elastic modulus of the plurality of first regions may be about twice or more higher than an elastic modulus of the second region.

The conductive layer may at least partially overlap with the plurality of first regions and the second region of the stretchable layer, respectively.

The ferromagnetic material may include ferromagnetic particles or aggregates thereof.

The ferromagnetic material may include a first metal selected from nickel (Ni), cobalt (Co), iron (Fe), manganese (Mn), an alloy thereof, or a combination thereof.

The ferromagnetic material may include ferromagnetic particles or aggregates thereof, and the ferromagnetic particles includes a core including the first metal and a shell including a second metal, the second metal being different from the first metal.

The elastomer may include a substituted or unsubstituted polyorganosiloxane, an elastomer including a substituted or unsubstituted butadiene moiety, an elastomer including a urethane moiety, an elastomer including an acrylic moiety, an elastomer including an olefin moiety, or a combination thereof.

The conductive nanostructure may include a conductive nanowire, a conductive nanotube, a conductive nanorod, a conductive nanofiber, or a combination thereof.

The stretchable sensor may be a stretchable strain sensor or a stretchable pressure sensor.

According to some example embodiments, a wearable device including the stretchable sensor is provided.

According to some example embodiments, a method of manufacturing a stretchable sensor includes preparing a mixture including a ferromagnetic material and an elastomer precursor, applying the mixture on a first substrate to form an uncured stretchable layer, burying at least a portion of a conductive layer including a plurality of conductive nanostructures in the uncured stretchable layer, self-aligning the ferromagnetic material in the uncured stretchable layer to establish a self-aligned ferromagnetic material, and curing the uncured stretchable layer to form a stretchable layer including a plurality of first regions including the self-aligned ferromagnetic material and a second region excluding the plurality of first regions.

The self-aligning the ferromagnetic material in the uncured stretchable layer may include disposing magnetizing molds on a top of the uncured stretchable layer and a bottom of the uncured stretchable layer, and applying magnetism to the magnetizing molds to vertically align the ferromagnetic material along a magnetic direction.

Each of the magnetizing molds may have a plurality of protruding portions.

The manufacturing method may further include, prior to the burying of at least the portion of the conductive layer in the uncured stretchable layer, coating a conductive nanostructure dispersion on a second substrate, the conductive nanostructure dispersion including the conductive nanostructure and a dispersive medium, and removing the dispersive medium from the coated conductive nanostructure dispersion to prepare a conductive layer for transfer.

The burying of at least the portion of the conductive layer in the uncured stretchable layer may include disposing the uncured stretchable layer and the conductive layer for transfer to face each other, pressing the second substrate toward the first substrate to bury at least a portion of the conductive layer for transfer into the uncured stretchable layer, and removing the second substrate from the first substrate.

The ferromagnetic material may include ferromagnetic particles including nickel (Ni), cobalt (Co), iron (Fe), manganese (Mn), an alloy thereof, or a combination thereof, and the conductive nanostructure may include a conductive nanowire, a conductive nanotube, a conductive nanorod, a conductive nanofiber, or a combination thereof.

The sensitivity and mechanical durability of the stretchable sensor may be improved without a complicated process.

DETAILED DESCRIPTION

Figure 1:
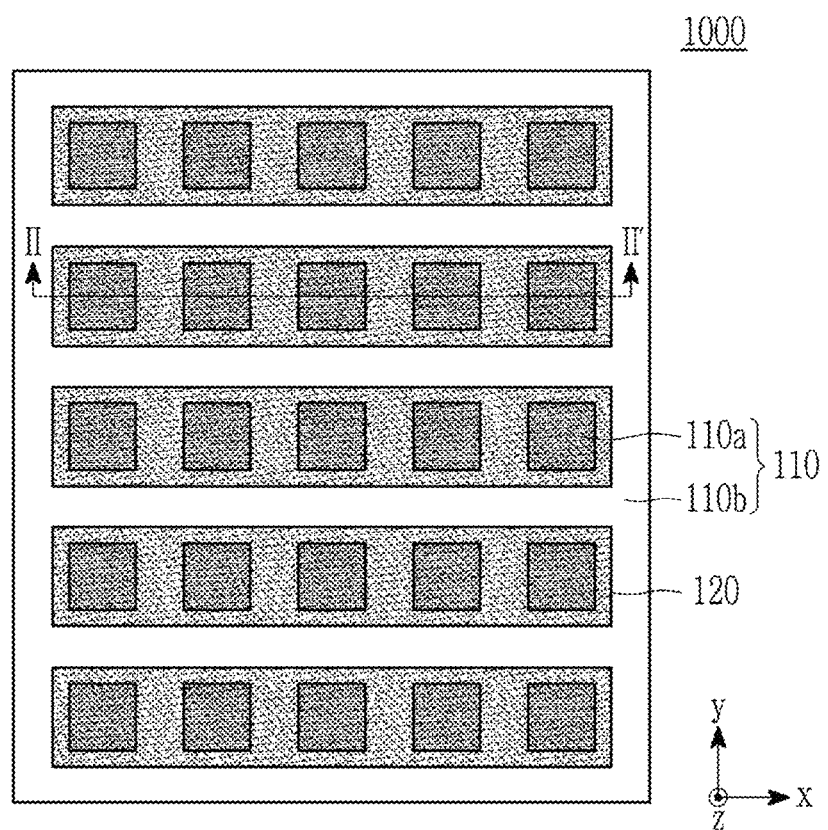
FIG. 1 is a plan view showing an example of a stretchable sensor according to some example embodiments.

Hereinafter, some example embodiments are described in detail so that those of ordinary skill in the art can easily implement them. However, the structures that are actually applied may be implemented in various different forms, and is not limited to the example embodiments described herein.

In the drawings, the thickness of layers, films, panels, regions, etc., are exaggerated for clarity.

It will be understood that when an element such as a layer, film, region, or substrate is referred to as being "on" another element, it may be directly on the other element or intervening elements may also be present. In contrast, when an element is referred to as being "directly on" another element, there are no intervening elements present.

As used herein, when a definition is not otherwise provided, "substituted" refers to replacement of a hydrogen atom of a compound or a functional group by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

Hereinafter, "combination" refers to a mixture of two or more and a stack structure of two or more.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, a stretchable sensor according to some example embodiments will be described with reference to the drawings.

The stretchable sensor according to some example embodiments may be a stretchable physical sensor configured to detect a degree of deformation of an object through a change in resistance caused by an external force, and may be, for example, a stretchable strain sensor, a stretchable pressure sensor, or a stretchable strain/pressure sensor.

Figure 2:
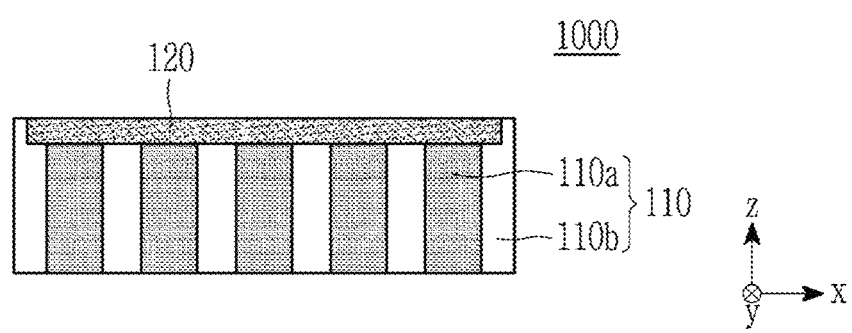
FIG. 2 is a cross-sectional view of the stretchable sensor of FIG. 1 taken along line II-II', FIGS. 3A, 3B, b 4, 5, 6, 7, 8, and 9 are schematic views showing an example of a method of manufacturing the stretchable sensor 1000 according to some example embodiments.

FIG. 1 is a plan view showing an example of a stretchable sensor according to some example embodiments, and FIG. 2 is a cross-sectional view of the stretchable sensor of FIG. 1 taken along line II-II'.

Referring to FIGS. 1 and 2, a stretchable sensor 1000 according to some example embodiments includes a stretchable layer 110 and a conductive layer 120.

The stretchable layer 110 may have a particular (or, alternatively, predetermined) elongation rate, flexibly respond to external forces such as twisting, pressing and pulling, or external motion, and may be easily restored to its original state.

The stretchable layer 110 may include an elastomer, and the elastomer may include, for example, an organic elastomer, an organic-inorganic elastomer, an inorganic elastomer-like material, or a combination thereof. The organic elastomer or organic-inorganic elastomer may include, for example, substituted or unsubstituted polyorganosiloxane such as polydimethylsiloxane (PDMS), an elastomer including a substituted or unsubstituted butadiene moiety such as styrene-ethylene-butylene-styrene (SEBS), an elastomer including a urethane moiety, an elastomer including an acrylic moiety, an elastomer including an olefin moiety, or a combination thereof, but is not limited thereto. The inorganic elastomer-like material may include a ceramic, a solid metal, a liquid metal having elasticity, or a combination thereof, but is not limited thereto.

The stretchable layer 110 includes at least one first region 110a and a second region 110b having different elastic moduluses. Herein, the elastic modulus may be Young's modulus. For example, the at least one first region 110a may be a rigid region having a relatively high elastic modulus, and the second region 110b may be a soft region having a relatively low elastic modulus. For example, the elastic modulus of the at least one first region 110a may be about twice or more higher than (e.g., equal to or greater than about twice as large as) the elastic modulus of the second region 110b, and within the above range, for example, about 3 times or more, about 4 times or more, or about 5 times or more, for example, about 2 to 100 times, about 3 to 100 times, about 4 to 100 times, or about 5 to 100 times higher than the elastic modulus of the second region 110b, but is not limited thereto.

A plurality of first regions 110a are distributed in the stretchable layer 110 and may be an optional structure separated from each other along the in-plane direction (e.g., xy direction) of the stretchable layer 110. Restated, the plurality of first regions 110a may be spaced apart from each other (e.g., isolated from direct contact with each other) along the in-plane direction. The plurality of first regions 110a may be arranged regularly or randomly along the in-plane direction (e.g., xy direction) of the stretchable layer 110, and may be arranged at particular (or, alternatively, predetermined) intervals between adjacent first regions 110a. Each first region 110a may extend in a thickness direction (e.g., z direction) of the stretchable layer 110. Each first region 110a may have, for example, a columnar shape extending in the thickness direction (e.g., z direction) of the stretchable layer 110, for example, from the lower surface to the upper surface (or the lower surface of the conductive layer 120) of the stretchable layer 110.

The plurality of first regions 110a may each include a ferromagnetic material, and the ferromagnetic material may be buried in the elastomer in each of the first regions 110a. The ferromagnetic material may be densely distributed in each of the first regions 110a, and the ferromagnetic material may be, for example, in the form of ferromagnetic particles or aggregates thereof. The ferromagnetic particles may have an average particle diameter of, for example, several nanometers to tens of micrometers, for example, greater than or equal to about 3 nm and less than about 100 μm, about 5 nm to about 80 μm, or about 10 nm to about 50 μm, but are limited thereto.

The ferromagnetic material may include, for example, a first metal selected from nickel (Ni), cobalt (Co), iron (Fe), manganese (Mn), an alloy thereof, or a combination thereof, and may be ferromagnetic particles including the first metal. The ferromagnetic material may be, for example, a core-shell type of ferromagnetic particles, and may include a core including a first metal selected from, for example, nickel (Ni), cobalt (Co), iron (Fe), manganese (Mn), an alloy thereof, or a combination thereof and a shell including a second metal different from the first metal. The second metal may be, for example, silver (Ag), gold (Au), copper (Cu), lead (Pb), platinum (Pt), or a combination thereof, but is not limited thereto. The first region 110a may be opaque due to the aforementioned ferromagnetic material, but is not limited thereto.

The second region 110b may be the remaining area except for the plurality of first regions 110a (e.g., may exclude the plurality of first regions 110a), and may be continuously connected over the whole surface of the stretchable layer 110 (e.g., may include a single, unitary piece of material comprising portions that are continuously connected to form the single, unitary piece of material in the stretchable layer 110). The second region 110b may ideally not include a ferromagnetic material but may also include a much smaller amount of ferromagnetic material than the first region 110a. The second region 110b mainly includes an elastomer and may be substantially transparent.

The plurality of first regions 110a and separate portions of the second region 110b may be alternately disposed (e.g., alternatively arranged, as shown in FIG. 1) along the length direction (e.g., x direction or y direction) of the stretchable layer 110, and accordingly rigid regions having a relatively high elastic modulus and soft regions having relatively low elastic modulus may be alternately arranged in the stretchable layer 110.

As described above, by including the regions having different elastic modulus in the stretchable layer 110, a strain distribution applied to the stretchable sensor 1000 may effectively be controlled when the stretchable sensor 1000 is stretched in a particular (or, alternatively, predetermined) direction (for example, the x direction and/or y direction). Specifically, sensitivity to strain changes of the stretchable sensor 1000 due to a sharp difference in elastic modulus between the first regions 110a and the second region 110b may be increased. This will be described later.

The conductive layer 120 may be at least partially buried in one surface (e.g., upper surface) of the stretchable layer 110 and thus may be at least partially buried in the stretchable layer 110, such that the conductive layer 120 may be at least partially located within a volume space that is defined by outermost surfaces (e.g., uppermost and lowermost surfaces in the z direction and outermost surfaces in the x and y directions) of the stretchable layer 110. For example, at least a portion of a thickness of the conductive layer 120 may be buried in the stretchable layer 110, for example, the whole thickness of the conductive layer 120 may be buried in the stretchable layer 110.

The conductive layer 120 may at least partially overlap with the plurality of first regions 110a and the second region 110b of the stretchable layer 110, respectively, along a thickness direction (e.g., z direction) of the stretchable layer 110. As shown in FIGS. 1-2, the conductive layer 120 may completely overlap the plurality of first regions 110a and may partially overlap the second region 110b of the stretchable layer 110, respectively, along a thickness direction (e.g., z direction) of the stretchable layer 110. For example, the conductive layer 120 may cover (e.g., overlap in the z direction) the whole surface of the stretchable layer 110 or the partial surface of the stretchable layer 110. When the conductive layer 120 covers the partial surface of the stretchable layer 110, a width of the conductive layer 120 may be equal to or larger than that of the first region 110a of the stretchable layer 110, and a length of the conductive layer 120 may be equal to or larger than a length sum of the plurality of first regions 110a.

The conductive layer 120 may include at least one conductive nanostructure (e.g., one or a plurality of conductive nanostructures). The at least one conductive nanostructure may include a material configured to show resistance changes by an external force, for example, a low-resistance metal. The at least one conductive nanostructure may be, for example, one or more linear conductive nanostructures, for example, one or more conductive nanowires, one or more conductive nanotubes, one or more conductive nanorods, one or more conductive nanofibers, or a combination thereof. For example, the at least one conductive nanostructure may be silver (Ag) nanowires, but are not limited thereto.

A plurality of the conductive nanostructures may be randomly arranged in the conductive layer 120, and the neighboring conductive nanostructures may contact each other and thus form a three-dimensional electrical network.

In some example embodiments, when the stretchable layer 110 is stretched in a particular (or, alternatively, predetermined) direction (e.g., x direction and/or y direction), the adjacent conductive nanostructures networked in the conductive layer 120 may be cut off and thus generate cracks and exhibit the resistance changes according to a change of the three-dimensional electrical network in the stretched and non-stretched states of the stretchable layer 110. Herein, as described above, since the first regions 110a and the second region 110b of the stretchable layer 110 have different elastic modulus, a different degree of strain may be applied to the first regions 110a and the second region 110b, and specifically, the first regions 110a having a relatively high elastic modulus of the stretchable layer 110 are relatively less stretched and receive relatively small strain, but the second region 110b having a relatively low elastic modulus of the stretchable layer 110 are relatively more stretched, so that the strain may be more concentrated thereon.

According to this strain distribution of the stretchable layer 110, relatively small cracks may be generated in the conductive layer 120 overlapped with the first regions 110a of the stretchable layer 110, but relatively larger cracks may be generated in the conductive layer 120 overlapped with the second region 110b of the stretchable layer 110. The stretchable sensor 1000 may be configured to sensitively detect deformation such as tension through the resistance changes based on the crack distribution, and furthermore, since the cracks of the conductive layer 120 may be concentratively generated where an elastic modulus between the first regions 110a and the second region 110b of the stretchable layer 110 is sharply changed, sensitivity of the stretchable sensor 1000 may be further increased and improved.

Accordingly, the stretchable sensor 1000 may exhibit a high gauge factor at even a relatively low strain, for example, a gauge factor of greater than or equal to about 20, greater than or equal to about 30, greater than or equal to about 40, or greater than or equal to about 50 at relatively low strain of less than about 10%, and within the range, a gauge factor of about 20 to about 100, about 30 to about 100, about 40 to about 100, or about 50 to about 100. Herein, the gauge factor is expressed as a resistance change rate per unit strain, wherein, the higher the gauge factor, the higher sensitivity the stretchable sensor 1000 exhibits.

In addition, the stretchable sensor 1000 has a structure that the plurality of first regions 110a having relatively high elastic modulus are buried in the stretchable layer 110, and thus effectively control the strain distribution without a separate structure above and/or below the stretchable layer 110 or without additional surface treatment of the stretchable layer 110. In addition, the stretchable sensor 1000 has a structure that at least a portion of the conductive layer 120 is also buried in one surface (e.g., upper surface) of the stretchable layer 110, and thus may prevent separation of the conductive layer 120 by an external environment and secure mechanical stability.

The stretchable sensor 1000 may be applied to (e.g., included in) various devices, for example, effectively to a wearable device attached to a living body or an object. For example, the stretchable sensor 1000 may be applied to a device attached to a skin and detect movements of the skin, for example, effectively applied to a silent voice recognition device attached to a face to implement communication from minute movements of facial muscles.

Hereinafter, an example of a method of manufacturing the aforementioned stretchable sensor 1000 according to some example embodiments is described with reference to the drawings.

FIGS. 3A, 3B, 4, 5, 6, 7, 8, and 9 are schematic views showing an example of a method of manufacturing the stretchable sensor 1000 according to some example embodiments.

The method of manufacturing the stretchable sensor 1000 according to some example embodiments may include preparing a conductive layer for transfer including at least one conductive nanostructure on a substrate for transfer, preparing a mixture including a ferromagnetic material and an elastomer precursor, applying the mixture on the substrate to form an uncured stretchable layer, bonding the uncured stretchable layer and the conductive layer for transfer to bury at least a portion of the conductive layer for transfer in the uncured stretchable layer, self-aligning a ferromagnetic material in the uncured stretchable layer, and curing the uncured stretchable layer to form a stretchable layer including a plurality of first regions including the self-aligned ferromagnetic material and second regions excluding the first regions.

Figure 3A:
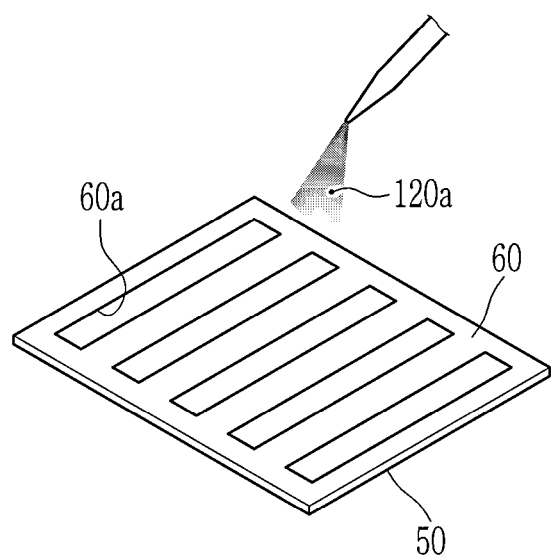
Figure 3B:
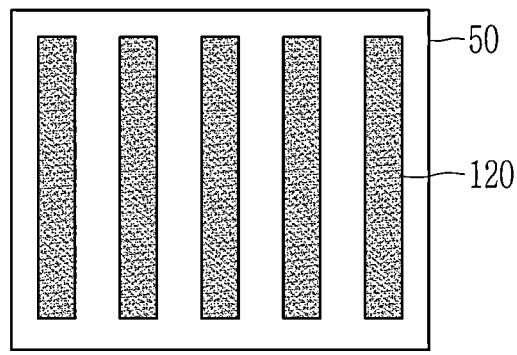

First, as shown in FIGS. 3A and 3B, a conductive layer 120 for transfer is prepared.

Referring to FIGS. 3A and 3B, the conductive layer 120 for transfer may be formed by disposing a mask 60 having a particular (or, alternatively, predetermined) pattern of openings 60a on a substrate for transfer 50 (also referred to herein as a second substrate) for transfer and coating at least one conductive nanostructure dispersion 120a including at least one conductive nanostructure on the substrate for transfer 50 to prepare the conductive layer 120 for transfer.

The substrate for transfer 50 may be, for example, a glass substrate, a polymer substrate, or a metal plate. The polymer substrate may include, for example, polycarbonate, polymethyl methacrylate, polyethylene terephthalate, polyethylene naphthalate, polyimide, polyamide, polyamideimide, Polyethersulfone, polyorganosiloxane, styrene-ethylene-butylene-styrene, polyurethane, polyacrylate, polyolefin, or a combination thereof, but the present inventive concepts are not limited thereto.

The mask 60 may be, for example, a metal mask, and the openings 60a of the mask 60 may have a substantially equivalent plane shape to that of the conductive layer 120, which is to form in the stretchable sensor 1000. For example, the openings 60a of the mask 60 may have a shape elongated in one direction.

The conductive nanostructure dispersion 120a may include at least one conductive nanostructure and a dispersive medium. The at least one conductive nanostructure, as described above, may include, for example, a conductive nanowire, a conductive nanotube, a conductive nanorod, a conductive nanofiber, or a combination thereof, and the dispersive medium may include, for example, water; alcohol such as methanol, ethanol, or propanol; or a combination thereof. The conductive nanostructure dispersion 120a may have, for example, a concentration of about 1 g/L to about 100 g/L and within the range, about 1 g/L to about 80 g/L, or about 1 g/L to about 50 g/L but is not limited thereto.

In FIG. 3A, the coating of the conductive nanostructure dispersion 120a may be performed by spraying, but is not limited thereto, and may include, for example, inkjet, spin-coating, slit-coating, dipping, or a combination thereof.

Subsequently, the coated conductive nanostructure dispersion is heat-treated to remove the dispersive medium to prepare the conductive layer 120 for transfer. The heat treatment may be performed simultaneously with the coating of the conductive nanostructure dispersion 120a or after the coating of the conductive nanostructure dispersion 120a. The heat treatment may be performed, for example, at about 30° C. to about 150° C. and within the range, about 50° C. to about 120° C. or about 60° C. to about 110° C. However, at room temperature, the dispersive medium may be removed, wherein the heat treatment may be omitted.

Subsequently, referring to FIG. 3B, the mask 60 is removed from the substrate for transfer 50 to form the conductive layer 120 for transfer.

Figure 4:
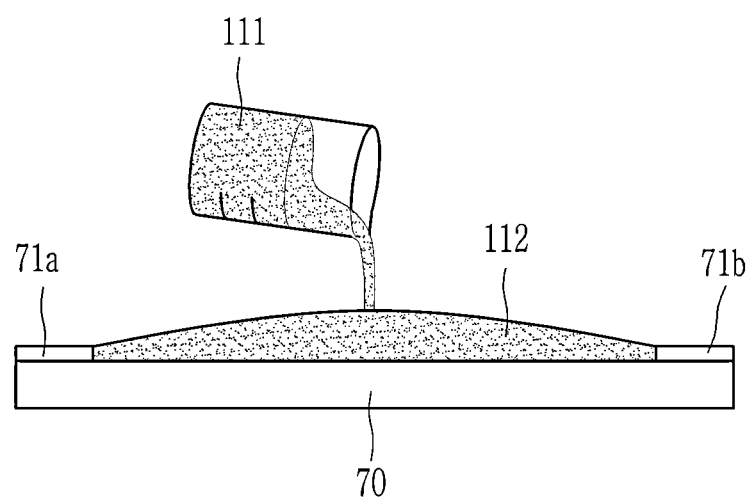

Referring to FIG. 4, a mixture 111 of the ferromagnetic material and an elastomer precursor is prepared and is applied on the substrate 70 (e.g., a first substrate) to form an uncured stretchable layer 112. The mixture 111 may be a solution having a particular (or, alternatively, predetermined) viscosity and may be poured onto the substrate 70 at a particular (or, alternatively, predetermined) speed.

The substrate 70 may be, for example, a glass substrate, a polymer substrate, or a metal plate, and the polymer substrate is the same as described above. At both of ends of the substrate 70, spacers 71a and 71b may be disposed to define a region where the uncured stretchable layer 112 is formed and a thickness thereof.

The mixture 111 may be prepared by mixing ferromagnetic particles (powder), for example a ferromagnetic material, in the elastomer precursor. The elastomer precursor may include a precursor for forming, for example a substituted or unsubstituted polyorganosiloxane such as polydimethylsiloxane PDMS, an elastomer including a substituted or unsubstituted butadiene moiety such as styrene-ethylene-butylene-styrene SEBS, an elastomer including a urethane moiety, an elastomer including an acrylic moiety, an elastomer including an olefin moiety, or a combination thereof, and may further include a hardener.

The ferromagnetic particles (e.g., ferromagnetic material) may be a powder type, for example, ferromagnetic particles including nickel (Ni), cobalt (Co), iron (Fe), manganese (Mn), an alloy thereof, or a combination thereof, or core-shell type ferromagnetic particles that the surfaces of the ferromagnetic particles are surrounded by other metals. For example, the ferromagnetic particles may be Ni particles coated with silver (Ag). In the mixture 111, the elastomer precursor and the ferromagnetic particles (powder) are mixed in a weight ratio of about 1:9 to about 9:1 and within the range, about 2:8 to about 8:2, about 3:7 to about 7:3, about 4:6 to about 6:4, or about 5:5.

The mixture 111 is sufficiently supplied between the spacers 71a and 71b and thus may form the uncured stretchable layer 112, and the uncured stretchable layer 112 may have a little convex surface. The uncured stretchable layer 112 may include the elastomer precursor in which the ferromagnetic particles (powder) and/or aggregates thereof are relatively uniformly distributed.

Figure 5:
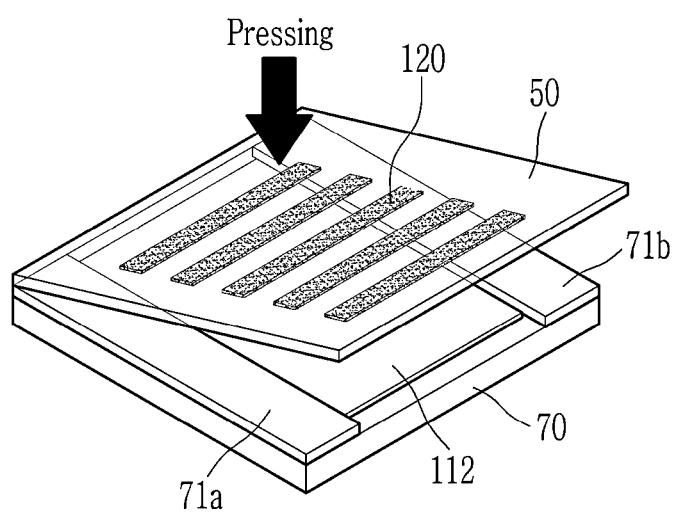
Figure 6:
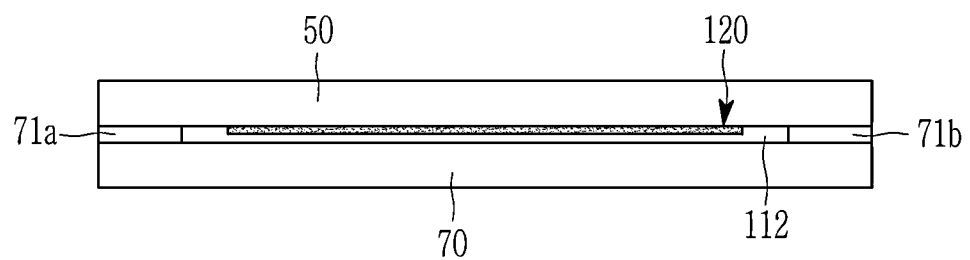

Referring to FIGS. 5 and 6, the substrate for transfer 50 on which the conductive layer 120 for transfer is formed may be disposed on the uncured stretchable layer 112, so that the uncured stretchable layer 112 may face the conductive layer 120 for transfer. Subsequently, the substrate for transfer 50 is pressed from the top surface with a particular (or, alternatively, predetermined) pressure towards the substrate 70 to bond the uncured stretchable layer 112 and the conductive layer 120 for transfer. Herein, since the uncured stretchable layer 112 is in a state of a liquid with viscosity, at least a portion of the conductive layer 120 for transfer, which may include at least one conductive nanostructure, may be buried in the uncured stretchable layer 112 based on the pressing of the substrate for transfer 50 towards the substrate 70, for example, the whole of the uncured stretchable layer 112 may be buried in the uncured stretchable layer 112.

Figure 7:
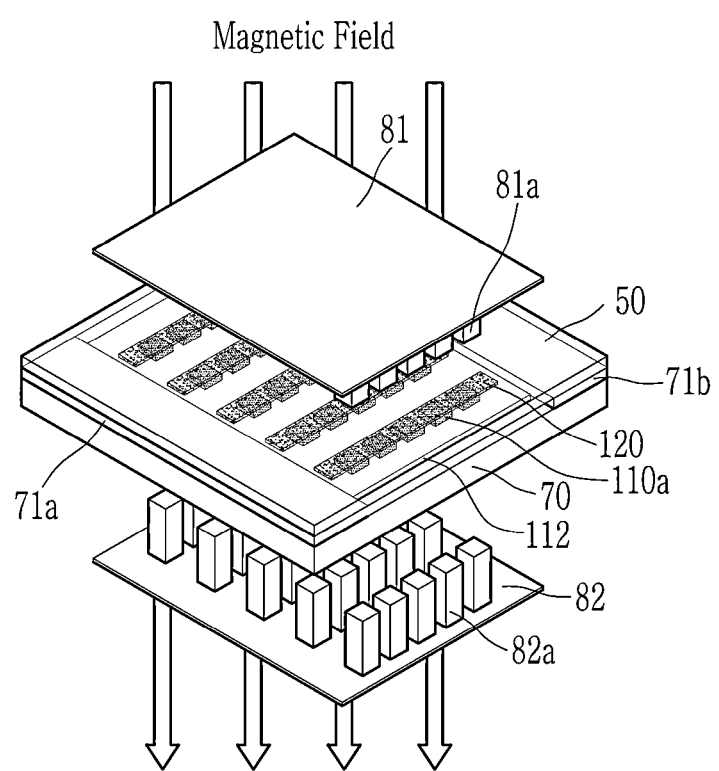

Referring to FIG. 7, magnetizing molds 81 and 82 are disposed above and below the uncured stretchable layer 112 (e.g., on a top of the uncured stretchable layer 112 and a bottom of the uncured stretchable layer 112). The magnetizing molds 81 and 82 may be, for example, ferromagnetic iron molds, and a plurality of protruding portions 81a and 82a may be arranged on the surface of the magnetizing molds 81 and 82. Restated, each of the magnetizing molds 81 and 82 may have a plurality of protruding portions 81a and 82a, respectively. The plurality of the protruding portions 81a of the magnetizing mold 81 may have substantially equal size and shape to those of the plurality of protruding portions 82a, and the first regions 110a may be formed between the plurality of protruding portions 81a and the plurality of protruding portions 82a. The plurality of protruding portions 81a and 82a may have substantially equal size and shape to those of the first regions 110a to be formed, and thus be determined by the size and shape of the first regions 110a to be formed.

Subsequently, when magnets (not shown) are respectively disposed above and below the magnetizing molds 81 and 82 to apply magnetism thereto, the ferromagnetic particles (powder) in the uncured stretchable layer 112 may be moved and gathered between the plurality of protruding portions 81*a* and 82*a* of the magnetizing molds 81 and 82 according to the applied magnetism, and thus selectively vertical-aligned along a magnetic direction, that is, a thickness direction of the uncured stretchable layer 112. The magnetism may thus be applied to the magnetizing molds 81 and 82 to vertically align the ferromagnetic material (e.g., ferromagnetic parties) along a magnetic direction, for example such that the ferromagnetic material is vertically aligned with the protruding portions 81*a* and 82*a* of the magnetizing molds 81 and 82. In other words, the ferromagnetic particles (powder) relatively uniformly distributed in the uncured stretchable layer 112 may be gathered at a particular (or, alternatively, predetermined) locations (between the plurality of protruding portions 81*a* and 82*a*) where the magnetism is provided, and thus form a plurality of ferromagnetic patterns extending in a column shape from the upper surface of the uncured stretchable layer 112 to the lower surface of the uncured stretchable layer 112, and the other regions excluding the plurality of ferromagnetic patterns may be substantially formed of the elastomer precursor. Accordingly, the ferromagnetic material (e.g., ferromagnetic particles) in the uncured stretchable layer 112 may be self-aligned to establish self-aligned ferromagnetic material.

Subsequently, the uncured stretchable layer 112 is cured, while the magnetism is maintained, to form the stretchable layer 110, such that the stretchable layer 110 includes a plurality of first regions 110*a* including the self-aligned ferromagnetic material (e.g., ferromagnetic particles) and a second region 110*b* that excludes the plurality of first regions 110*a*. The plurality of ferromagnetic patterns in the stretchable layer 110 may be fixed by curing to form a plurality of the first regions 110*a*, but the other regions except for the plurality of the first regions 110*a* may form the second region 110*b* formed of elastomer. In addition, the transferred conductive layer 120 may be fixed and buried in the upper surface of the stretchable layer 110.

Subsequently, the magnets and the magnetizing molds 81 and 82 are removed.

Figure 8:
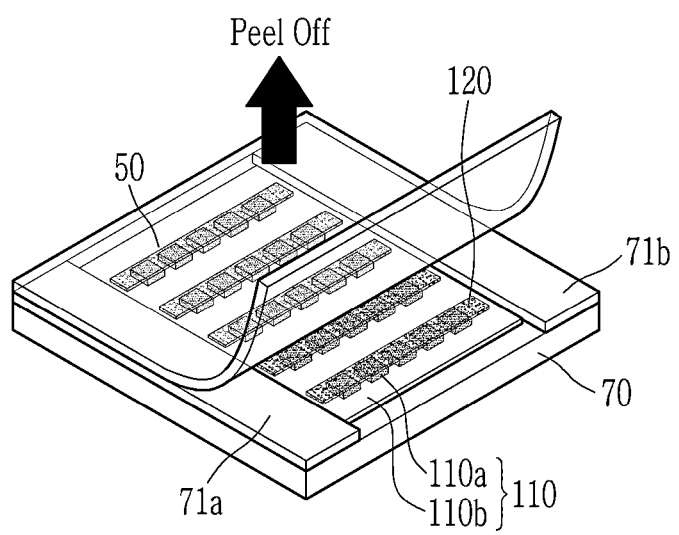

Referring to FIG. 8, the substrate for transfer 50 may be removed from the substrate 70 to form the stretchable layer 110 including the plurality of first regions 110*a* and second region 110*b*, and the buried conductive layer 120.

Figure 9:
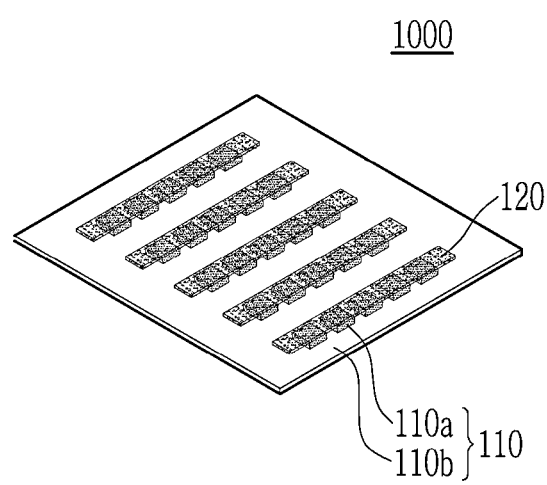

Subsequently, referring to FIG. 9, the stretchable layer 110 is separated from the substrate 70, manufacturing the stretchable sensor 1000.

According to some example embodiments, the magnetizing molds 81 and 82 are used to easily form the first regions 110*a* and the second region 110*b* having different elastic modulus in the stretchable layer 110, without forming a separate structure on the substrate 70 or not performing a surface treatment. In addition, since a shape and a size of the plurality of first regions 110*a* may be adjusted according to a shape and a size of the protruding portions 81*a* and 82*a* of the magnetizing molds 81 and 82, the stretchable sensor 1000 may be easily designed. In addition, since the elastic modulus of the first regions 110*a* of the stretchable layer 110 may be adjusted according to a concentration of the ferromagnetic particles (powder) in the mixture 111, the elastic modulus difference between the first regions 110*a* and the second region 110*b* in the stretchable layer 110 may be effectively adjusted.

Hereinafter, some example embodiments are illustrated in more detail with reference to one or more examples. However, the present scope of the inventive concepts is not limited to these examples.

EXAMPLE

Manufacture of Stretchable Sensor

Preparation Example 1

Preparation of Elastomer-AgNi Mixture

AgNi particles (an average particle size: 10 μm, SN08P40, Potters Industries, Inc.) are added to Polydimethylsiloxane (PDMS) (resin:hardener=10:1 (w/w)) (Sylgard 184, DowhiTech Co., Ltd.) and then, stirred with a paste mixer (ARE-310, Thinky U.S.A., Inc.) to prepare an AgNi-PDMS mixture. Herein, the polydimethylsiloxane and the Ag—Ni particles are mixed in a weight ratio of 1:1.

Preparation Example 2

Preparation of Conductive Layer for Transfer

A metal mask having a plurality of openings extending in one direction is disposed on a polyethylenenaphthalate (PEN) substrate (70 mm×70 mm×125 μm). Each opening of the metal mask respectively has a rectangular shape with a width of 1.2 mm and a length of 50 mm and a spacing of 6 mm with its neighboring opening. Subsequently, a polyethylenenaphthalate (PEN) substrate is placed on a hot plate (90° C.), and Ag nanowire dispersion (a concentration: 5 g/L, a dispersive medium: ethanol, Yurui Chemical Co., Ltd.) is sprayed on the metal mask to form a conductive layer for transfer. The spraying is performed by using a spray coater (Enjet, LLC) under conditions of a pressure 0.15 MPa, a supply flow rate of 0.5 mL/min, a nozzle movement speed of 50 mm/min, and a spray height of 20 mm.

Preparation Example 3

Manufacture of Stretchable Sensor

The AgNi-PDMS mixture obtained by Preparation Example 1 is poured onto a glass substrate equipped with a 60 μm-thick spacer to form an uncured stretchable layer. The uncured stretchable layer is covered with the conductive layer for transfer according to Preparation Example 2 and then, pressed with a particular (or, alternatively, predetermined) force. Subsequently, each iron mold having a plurality of protruding portions (cross-section: 1.2 mm×1.2 mm) is disposed on the top and at the bottom of the uncured stretchable layer, and each magnet (a samarium cobalt magnet, 1000 Gauss or more) is placed on the top and at the bottom of the iron mold to apply magnetism thereto. The uncured stretchable layer is cured, while the magnetism is maintained, forming a stretchable layer. Subsequently, the polyethylenenaphthalate (PEN) substrate is removed and the stretchable layer is separated from the glass substrate to manufacture a stretchable sensor.

Evaluation I

The cross-section of the stretchable sensor according to an Example is examined.

Figure 10:
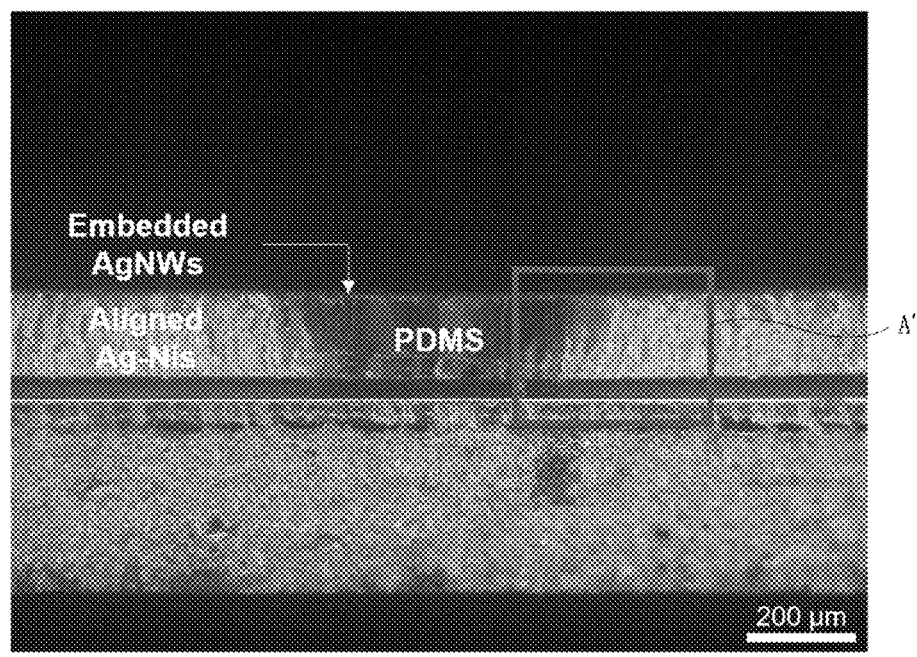
FIG. 10 is an optical microscopic photograph of the stretchable sensor according to an Example.
Figure 11:
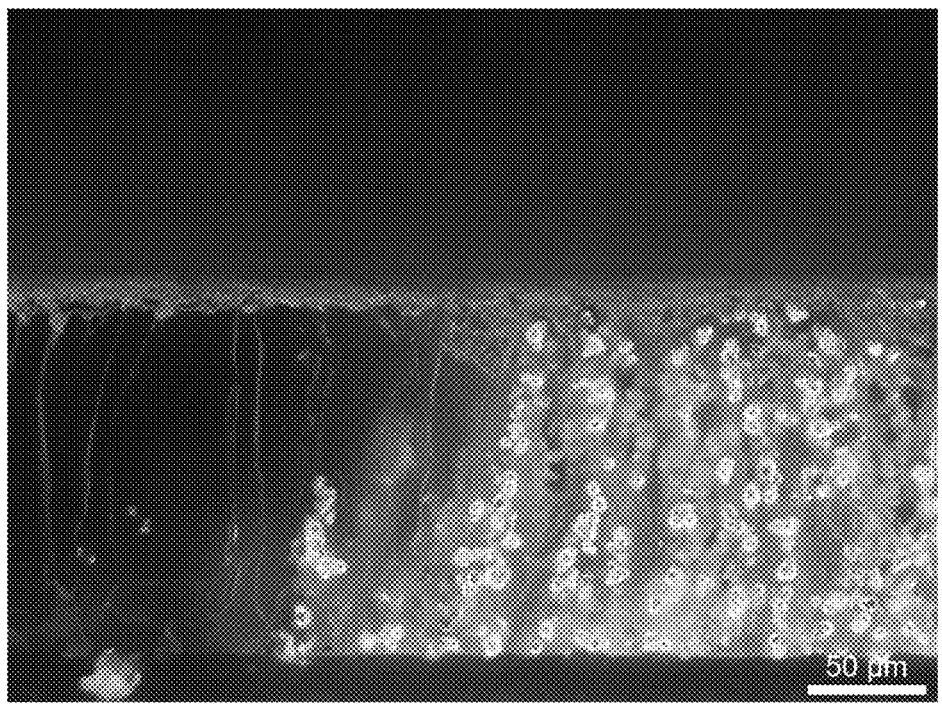
FIG. 11 is an enlarged photograph of portion A' of FIG. 10, FIGS. 12A and 12B are optical microscopic photographs showing a crack in a conductive layer before and after stretching of a stretchable sensor according to an Example.

FIG. 10 shows an optical microscopic photograph of the stretchable sensors according to an Example, and FIG. 11 is an enlarged photograph of portion A' of FIG. 10.

Referring to FIGS. 10 and 11, the stretchable sensor according to an Example has a first region (a bright area) where AgNi particles are concentrated in the stretchable layer and a second region (a dark area) formed of PDMS along the length direction (x direction) and shows that a conductive layer is buried on the upper surface of the stretchable layer.

Evaluation II

In the stretchable sensor according to an Example, each elastic modulus of the first region where the AgNi particles are concentrated and the second region formed of PDMS is evaluated.

The elastic modulus is measured from a strain-stress curve obtained by using a universal testing system (UTM, Instron 5567).

As a testing result, in the stretchable sensor according to an Example, an elastic modulus of the first region where the AgNi particles are concentrated is about 10 MPa, and an elastic modulus of the second region formed of PDMS is about 2 MPa, and accordingly, the elastic modulus of the first region is about five times higher than that of the second region.

Evaluation III

When the stretchable sensor according to an Example is stretched in the length direction (x direction), cracks in the stretchable layer are evaluated.

The stretching is performed by 10% of the initial length at 25 mm/min.

Figure 12A:
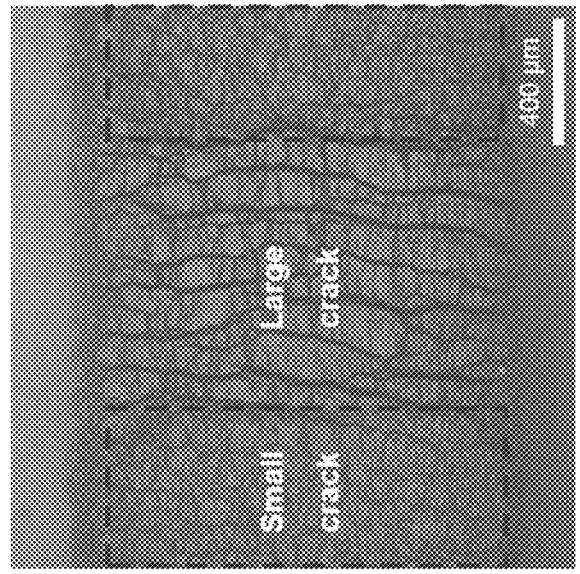
Figure 12B:
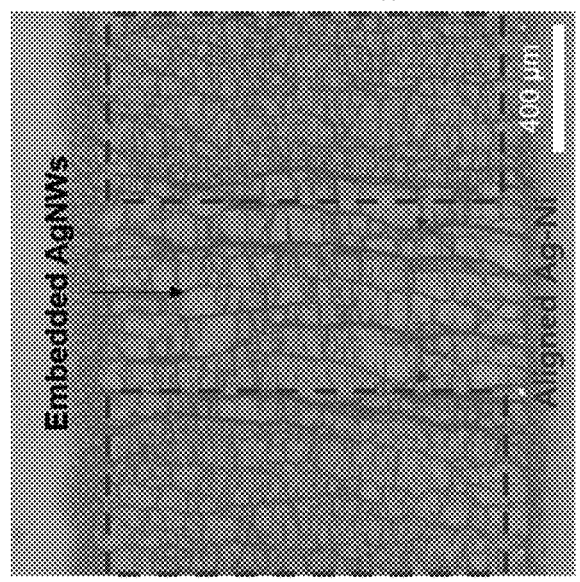

FIGS. 12A and 12B are optical microscopic photographs showing cracks in a conductive layer before and after stretching of the stretchable sensor according to an Example.

Referring to FIGS. 12A and 12B, since the first region where the AgNi particles are concentrated is less stretched than the second region formed of PDMS, relatively smaller cracks are generated in the conductive layer overlapped with the first region, but relatively larger cracks are generated in the conductive layer overlapped with the second region. Since the stretchable sensor according to an Example may measure strain based on the crack generation, sensitivity of the sensor may be examined through resistance changes by using a control of the crack generation.

Evaluation IV

The stretchable sensor according to an Example is evaluated with respect to the resistance changes, when stretched in the length direction (x direction).

The stretching is performed by 10% of the initial length at 25 mm/min and restored, and the stretching and the restoration are 100 times repeated.

Figure 13:
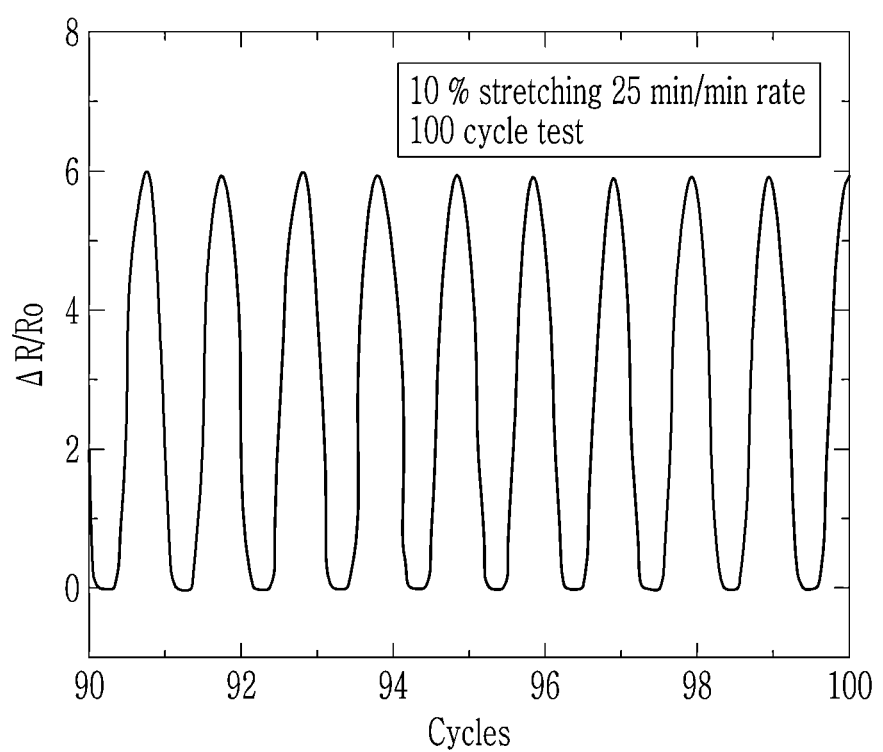
FIG. 13 is a graph showing a change in resistance during repeated stretching 100 times of the stretchable sensor according to an Example.
Figure 14:
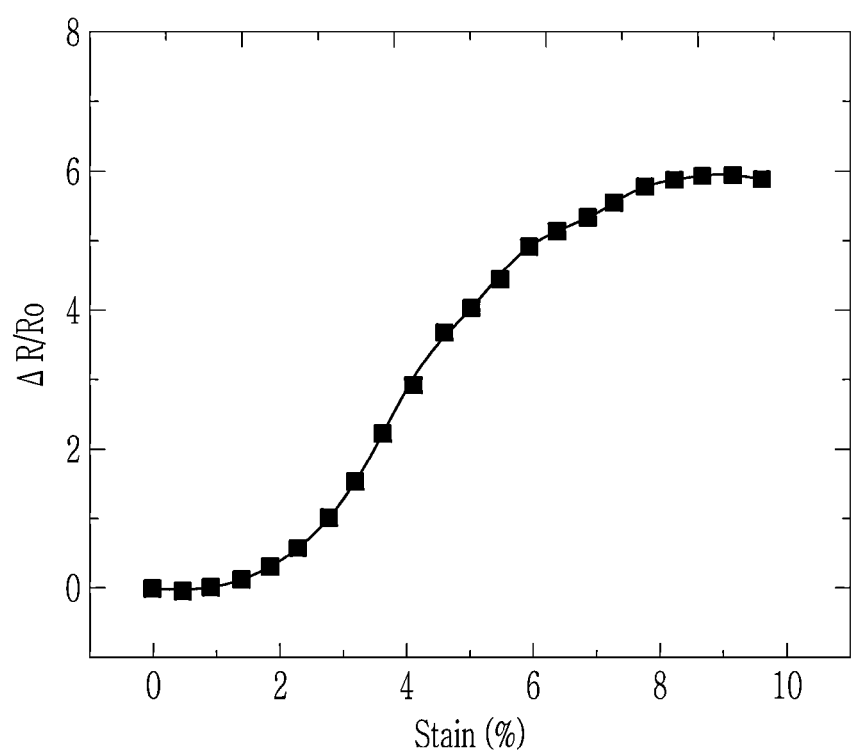
FIG. 14 is a graph showing a change in resistance according to strain of a stretchable sensor according to an Example.

The results are shown in FIGS. 13 and 14 and Table 1.

FIG. 13 is a graph showing a change in resistance during repeated stretching 100 times of the stretchable sensors according to an Example, and FIG. 14 is a graph showing resistance changes depending on strain of the stretchable sensor according to an Example.

TABLE 1

|  | 1$^{st}$ Cycle | 100$^{th}$ Cycle |
| --- | --- | --- |
| Resistance (Ω) | 3.16 | 3.08 |
| Gauge factor | 60.5 | 61.4 |

Referring to FIGS. 13 and 14 and Table 1, the stretchable sensor according to an Example exhibits relatively constant resistance changes during 100 times repeated stretchings, and thus improved sensitivity at 10% strain.

While some example embodiments of the inventive concepts have been described in connection with what is presently considered to be practical example embodiments, it is to be understood that the inventive concepts are not limited to such example embodiments. On the contrary, the example embodiments of the inventive concepts are intended to cover various modifications and equivalent arrangements included within the spirit and scope of the appended claims.

What is claimed is:

1. A stretchable sensor, comprising:
    a stretchable layer including an elastomer; and
    a conductive layer at least partially buried in the stretchable layer, the conductive layer including a conductive nanostructure,
    wherein the stretchable layer includes
        a plurality of first regions including a ferromagnetic material buried in the elastomer, and
        a second region excluding the plurality of first regions.

2. The stretchable sensor of claim 1, wherein the plurality of first regions and the second region of the stretchable layer have an elastic modulus different from each other.

3. The stretchable sensor of claim 1, wherein
    the plurality of first regions are separately distributed along an in-plane direction of the stretchable layer, and
    the second region is a single piece of material comprising portions that are continuously connected in the stretchable layer.

4. The stretchable sensor of claim 1, wherein the plurality of first regions and separate portions of the second region are alternately arranged along a length direction of the stretchable layer.

5. The stretchable sensor of claim 1, wherein each first region of the plurality of first regions extends in a thickness direction of the stretchable layer.

6. The stretchable sensor of claim 1, wherein an elastic modulus of the plurality of first regions is about twice or more higher than an elastic modulus of the second region.

7. A stretchable sensor, comprising:
    a stretchable layer including an elastomer; and
    a conductive layer at least partially buried in the stretchable layer, the conductive layer including a conductive nanostructure,
    wherein the stretchable layer includes
        a plurality of first regions including a ferromagnetic material buried in the elastomer, and
        a second region excluding the plurality of first regions, and
    wherein the conductive layer at least partially overlaps with the plurality of first regions and the second region of the stretchable layer, respectively.

8. The stretchable sensor of claim 1, wherein the ferromagnetic material comprises ferromagnetic particles or aggregates thereof.

9. The stretchable sensor of claim 1, wherein the ferromagnetic material comprises a first metal selected from nickel (Ni), cobalt (Co), iron (Fe), manganese (Mn), an alloy thereof, or a combination thereof.

10. The stretchable sensor of claim 9, wherein
    the ferromagnetic material comprises ferromagnetic particles or aggregates thereof, and
    each of the ferromagnetic particles comprises
        a core including the first metal, and
        a shell including a second metal, the second metal being different from the first metal.

11. The stretchable sensor of claim 1, wherein the elastomer comprises a substituted or unsubstituted polyorganosiloxane, an elastomer including a substituted or unsubstituted butadiene moiety, an elastomer including a urethane moiety, an elastomer including an acrylic moiety, an elastomer including an olefin moiety, or a combination thereof.

12. The stretchable sensor of claim 1, wherein the conductive nanostructure comprises a conductive nanowire, a conductive nanotube, a conductive nanorod, a conductive nanofiber, or a combination thereof.

13. The stretchable sensor of claim 1, wherein the stretchable sensor is a stretchable strain sensor or a stretchable pressure sensor.

14. A wearable device comprising the stretchable sensor of claim 1.

15. A method of manufacturing a stretchable sensor, the method comprising:
preparing a mixture including a ferromagnetic material and an elastomer precursor,
applying the mixture on a first substrate to form an uncured stretchable layer,
burying at least a portion of a conductive layer including a conductive nanostructure in the uncured stretchable layer,
self-aligning the ferromagnetic material in the uncured stretchable layer to establish a self-aligned ferromagnetic material, and
curing the uncured stretchable layer to form a stretchable layer including a plurality of first regions including the self-aligned ferromagnetic material and a second region excluding the plurality of first regions.

16. The method of claim 15, wherein
the self-aligning of the ferromagnetic material in the uncured stretchable layer comprises
disposing magnetizing molds on a top of the uncured stretchable layer and a bottom of the uncured stretchable layer, and
applying magnetism to the magnetizing molds to vertically align the ferromagnetic material along a magnetic direction.

17. The method of claim 16, wherein each of the magnetizing molds has a plurality of protruding portions.

18. The method of claim 15, further comprising:
prior to the burying of at least the portion of the conductive layer in the uncured stretchable layer,
coating a conductive nanostructure dispersion on a second substrate, the conductive nanostructure dispersion including the conductive nanostructure and a dispersive medium, and
removing the dispersive medium from the coated conductive nanostructure dispersion to prepare the conductive layer as a conductive layer for transfer.

19. The method of claim 18, wherein
the burying of at least the portion of the conductive layer in the uncured stretchable layer comprises
disposing the uncured stretchable layer and the conductive layer for transfer to face each other,
pressing the second substrate toward the first substrate to bury at least a portion of the conductive layer for transfer into the uncured stretchable layer, and
removing the second substrate from the first substrate.

20. The method of claim 15, wherein
the ferromagnetic material comprises ferromagnetic particles including nickel (Ni), cobalt (Co), iron (Fe), manganese (Mn), an alloy thereof, or a combination thereof, and
the conductive nanostructure comprises a conductive nanowire, a conductive nanotube, a conductive nanorod, a conductive nanofiber, or a combination thereof.

* * * * *